United States Patent
Wada et al.

(10) Patent No.: US 7,274,320 B2
(45) Date of Patent: Sep. 25, 2007

(54) ANALOG/DIGITAL CONVERTING DEVICE

(75) Inventors: Atsushi Wada, Ogaki (JP); Kuniyuki Tani, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/506,778

(22) Filed: Aug. 21, 2006

(65) Prior Publication Data

US 2006/0279447 A1     Dec. 14, 2006

Related U.S. Application Data

(62) Division of application No. 11/114,004, filed on Apr. 26, 2005.

(51) Int. Cl.
*H03M 1/12* (2006.01)

(52) U.S. Cl. ...................................... 341/155; 341/156

(58) Field of Classification Search ................ 341/161, 341/156, 143, 139, 120
See application file for complete search history.

(56) References Cited

U.S. PATENT DOCUMENTS

| | | | |
|---|---|---|---|
| 4,999,628 A * | 3/1991 | Kakubo et al. ............. | 341/139 |
| 5,854,711 A * | 12/1998 | Kaneda ...................... | 359/697 |
| 5,907,299 A * | 5/1999 | Green et al. ................ | 341/143 |
| 6,282,611 B1 * | 8/2001 | Hamamoto et al. ......... | 711/115 |
| 6,323,800 B1 * | 11/2001 | Chiang ....................... | 341/161 |
| 6,384,757 B1 * | 5/2002 | Kosonen ..................... | 341/120 |
| 6,489,904 B1 * | 12/2002 | Hisano ....................... | 341/120 |
| 6,580,383 B1 * | 6/2003 | Devendorf et al. ......... | 341/143 |
| 6,778,126 B2 * | 8/2004 | Ali .............................. | 341/156 |

FOREIGN PATENT DOCUMENTS

JP         09-275342         10/1997

* cited by examiner

*Primary Examiner*—Jean Bruner Jeanglaude
(74) *Attorney, Agent, or Firm*—McDermott Will & Emery LLP

(57) ABSTRACT

The present invention provides a widely general-purpose A/D converting device. The A/D converting device comprises multiple signal conversion units each of which include: an A/D converter for converting an input analog signal into a digital signal with a predetermined number of bits; a D/A converter for converting the output from the A/D converter into an analog signal; a subtracter for subtracting the output signal from the D/A converter, from the input analog signal; and an amplifier for amplifying the output signal from the subtracter. The A/D converting device has a configuration wherein the signal conversion units are arrayed in multiple rows and columns. This allows the user to realize an A/D converting device having various types and levels of performance by making various combinations of the signal conversion units without change of the layout of the signal conversion units.

11 Claims, 13 Drawing Sheets

US 7,274,320 B2

ANALOG/DIGITAL CONVERTING DEVICE

RELATED APPLICATIONS

This application is a divisional application of Ser. No. 11/061,668, filed Feb. 22, 2005, now U.S. Pat. No. 7,119,728, which claims priority of Japanese Patent application Nos. 2004-055220 and 2004-055221, filed Feb. 27, 2004, the contents of which are herewith incorporated by reference.

BACKGROUND OF THE INVENTION

1. Field of the Invention

The present invention relates to a signal conversion technique, and particularly to an analog/digital converting device for converting analog signals into the corresponding digital signals.

2. Description of the Related Art

As an example of a circuit for converting input analog signals into digital signals, a pipeline A/D converter is known (see Japanese Unexamined Patent Application Publication No. 9-275342, for example). The pipeline A/D converter is formed of multiple signal conversion units one to another, each of which have a function for low-bit analog/digital conversion. With such a configuration, the pipeline A/D converter performs A/D conversion in steps by actions of each signal conversion unit. Also, a cyclic A/D converter has been proposed wherein the output from a signal conversion unit including a subtracting/amplifying output unit is input to the same signal conversion unit as a feedback signal so as to perform A/D conversion multiple times with the same single conversion unit.

In general, each analog circuit block included in a system LSI is designed according to predetermined specifications. Accordingly, development of an analog circuit block according to different specifications requires redesign thereof. Design/development for an analog circuit block requires a great number of steps such as layout and wiring, logic verification, trial manufacturing, and evaluation. In some cases, these steps require several months, leading to a bottleneck problem in development of a system LSI. Development of an analog/digital converter has the same problem, as well. In particular, in rapidly advancing fields such as image processing, communication, and so forth, demand for a high-speed and high-precision A/D converter is increasing, leading to a demand for a technique for reducing development time of such an A/D converter.

SUMMARY OF THE INVENTION

The present invention has been made in view of the above problems, and accordingly, it is an object thereof to provide a widely general-purpose A/D converting device.

A first aspect of the present invention relates to an analog/digital converting device. The analog/digital converting device comprises multiple signal conversion units including: an A/D converter for converting an input analog signal into a digital signal with a predetermined number of bits; a D/A converter for converting the output from the A/D converter into an analog signal; and a subtracter for subtracting the output signal from the D/A converter, from the input analog signal, with the signal conversion units being disposed in multiple rows and columns. The layout of the multiple signal conversion units in the form of a matrix allows the user to make flexible design of a combination of the signal conversion units, the connection order thereof, and so forth.

The signal conversion unit may further include an amplifier for amplifying the output signal from the subtracter. This improves the conversion precision in the step wherein the lower-bit digital signal is obtained using the output signal from the signal conversion unit.

At least one of the multiple signal conversion units may include a switching unit for switching whether the output signal from the same signal conversion unit is input as the input analog signal, or the external signal is input as the input analog signal. This enables multi-feedback A/D conversion of the signal conversion unit, thereby reducing the circuit area. Furthermore, this allows the user to set the number of the feedback loops to a desired number, thereby improving degree-of-freedom from the perspective of circuit design.

At least one of the multiple signal conversion units may include a selecting means for selecting the input source for the input analog signal or the output destination for the output signal from the signal conversion unit. The selecting means may be formed of a wiring area for connecting the signal conversion unit to the input source or the output destination. In the wiring step, the input source or the output destination may be fixedly determined by wiring. Furthermore, a switching element may be employed as the aforementioned selecting means. The selecting means may include a switching element such as a transistor or the like, for electrically switching the input source or the output destination for signals. This enables dynamic switching control, thereby realizing a further improved general-purpose A/D converting device.

A second aspect of the present invention also relates to an analog/digital converting device. The analog/digital converting device comprises a signal conversion unit including: an A/D converter for converting an input analog signal into a digital signal with a predetermined number of bits; a D/A converter for converting the output from the A/D converter into an analog signal; and a subtracter for subtracting the output signal from the D/A converter, from the input analog signal, and a selecting means for selecting the input source for the input analog signal or the output destination for the output signal from the signal conversion unit.

The selecting means allows the user to make a desired combination of the input source and the output destination for signals regarding each signal conversion unit, thereby realizing an analog/digital converting device following various specifications. Thus, the present invention provides a widely general-purpose A/D converting device.

The signal conversion unit may further comprise an amplifier for amplifying the output signal from the subtracter. This improves the conversion precision in the step wherein the lower-bit digital signal is obtained using the output signal from the signal conversion unit.

The signal conversion unit may include a switching unit for switching whether the output signal from the same signal conversion unit is used as the input analog signal or the external signal is used as the input analog signal. This enables multi-feedback A/D conversion of the signal conversion unit, thereby reducing the circuit area. Furthermore, this allows the user to set the number of the feedback loops to a desired number, thereby improving degree-of-freedom from the perspective of circuit design.

The selecting means may be able to select the input source or the output destination from multiple circuits adjacent to the signal conversion unit. For example, an arrangement may be made wherein each of the four sides, i.e., the upper, lower, left, and right sides of the signal conversion unit, includes the selecting means for selecting the input source or the output destination, from the circuits adjacent to the upper, lower, left, and right sides of the signal conversion unit. This further improves degree-of-freedom from the perspective of circuit design. Note that another signal conversion unit or another desired circuit may be selected as the input source or the output destination.

The analog/digital converting device may include multiple signal conversion units each of which includes the selecting means. The multiple signal conversion units may be arrayed in multiple rows and columns, as well as being arrayed in a line.

The selecting means may be formed of a wiring area for connecting the signal conversion unit to the input source or the output destination. In the wiring step, the input source or the output destination may be fixedly determined by wiring.

A switching element may be employed as the aforementioned selecting means. The selecting means may include a switching element such as a transistor or the like, for electrically switching the input source or the output destination for signals. This enables dynamic switching control, thereby realizing a further improved general-purpose A/D converting device.

The analog/digital converting device may further include a switching control means for controlling on/off operation of the switching element. The switching control means may control on/off operation of the switching devices corresponding to the performance required for the analog/digital converting device. Such a configuration allows the user to modify the combination of the signal conversion units or the connection order thereof with high flexibility by on/off operation of the switching element, thereby realizing an analog/digital converting device following various specifications. Furthermore, this enables an analog/digital converting device wherein the performance thereof can be dynamically changed corresponding to the operation mode or the like of a device including the analog/digital converting device.

Furthermore, an arrangement may be made wherein, in the event that there are any signal conversion units not used in a particular mode as a result of on/off operation of the switching element, the switching control means reduces power supply for the signal conversion units not used in this particular mode. In this case, the switching control means may stop power supply for the signal conversion units not used in this particular mode. This reduces power consumption of the A/D converting device.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

First Embodiment

An A/D converting device according to the present embodiment has an array configuration wherein low-bit signal-conversion units, each having a function for low-bit analog/digital conversion, are arrayed in multiple rows and columns. With the present embodiment, the signal conversion units may be two-dimensionally arrayed as well as being arrayed in a single line, thereby improving degree-of-freedom from the perspective of layout design, and thereby realizing a layout following various specifications with high flexibility. Also, the present embodiment allows the user to design an A/D converting device according to required specifications by making a desired combination of IPs (Intellectual Property) in the form of an array, each of which action has been verified, thereby enabling great reduction of time, costs, and so forth, required for design and development thereof.

Figure 1:
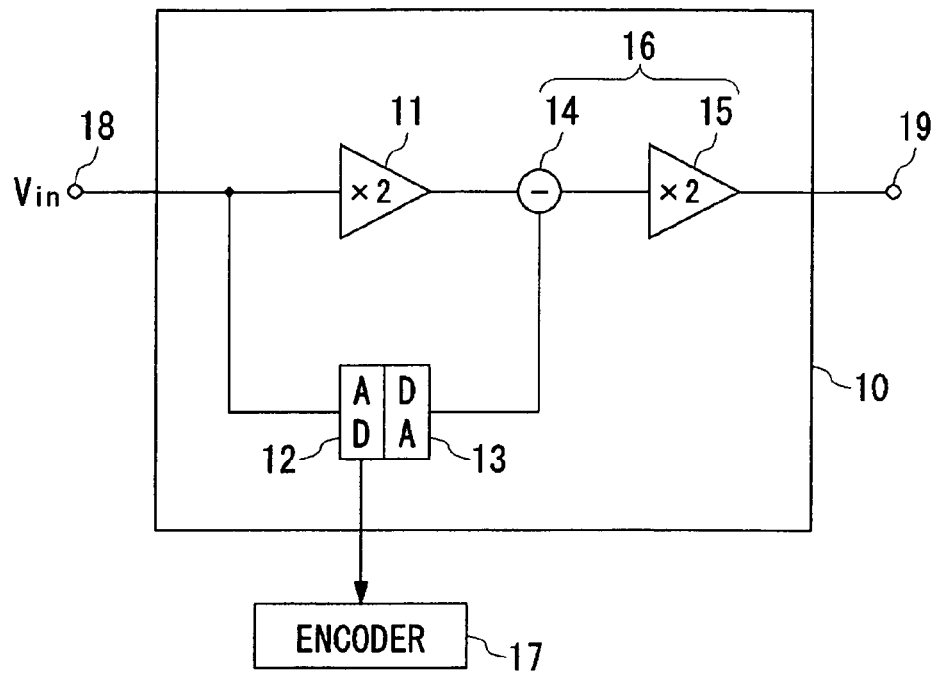
FIG. 1 is a diagram which shows a configuration of a pipeline A/D conversion unit according to a first embodiment.

FIG. 1 shows a configuration of a signal conversion unit 10 according to a first embodiment. The signal conversion unit 10 serves as a unit component of a pipeline A/D converting device, which will be referred to as "pipeline A/D conversion unit 10" hereafter. The pipeline A/D conversion unit 10 includes a first amplifier 11, an A/D converter 12, a D/A converter 13, and a subtracting/amplifying unit 16. The subtracting/amplifying unit 16 includes a subtracter 14 and a second amplifier 15.

The analog signal Vin input to an input terminal 18 is input to the A/D converter 12 so as to be converted into a digital signal with a predetermined number of bits. The digital signal is output to an encoder 17 and the D/A converter 13. The D/A converter 13 converts the digital signal output from the A/D converter 12 into an analog signal. At this time, the D/A converter 13 amplifies the analog signal with an amplification factor of 2, and outputs the amplified signal to the subtracter 14. The first amplifier 11 samples and holds the input analog signal Vin, and amplifies Vin with an amplification factor of 2, and outputs the amplified signal to the subtracter 14. Note that the amplification factor of the first amplifier 11 and the D/A converter 13 is not restricted to 2, rather an amplifier and a D/A converter with a desired amplification factor may be employed as the first amplifier 11 and the D/A converter 13, respectively. Furthermore, an arrangement may be made without the first amplifier 11. In this case, a configuration is designed such that the D/A converter 13 outputs the analog signal to the subtracter 14 with an amplification factor of 1. The subtracter 14 subtracts, from the analog signal output from the first amplifier 11, the analog signal output from the D/A converter 13. The second amplifier 15 amplifies and outputs the analog signal output from the subtracter 14 with an amplification factor of 2. The amplification factor of the second amplifier 15 is not restricted to 2, rather an amplifier with a desired amplification factor may be employed as the second amplifier 15. For example, with a configuration wherein the A/D converter 12 acquires two-bit digital signals, an arrangement is preferably employed wherein the analog signal is amplified with an amplification factor of 4 by actions of the first amplifier 11 and the second amplifier 15. The output from the second amplifier 15 is output from the pipeline A/D conversion unit 10 through the output terminal 19, and is input to the downstream A/D conversion unit, for example.

Figure 2:
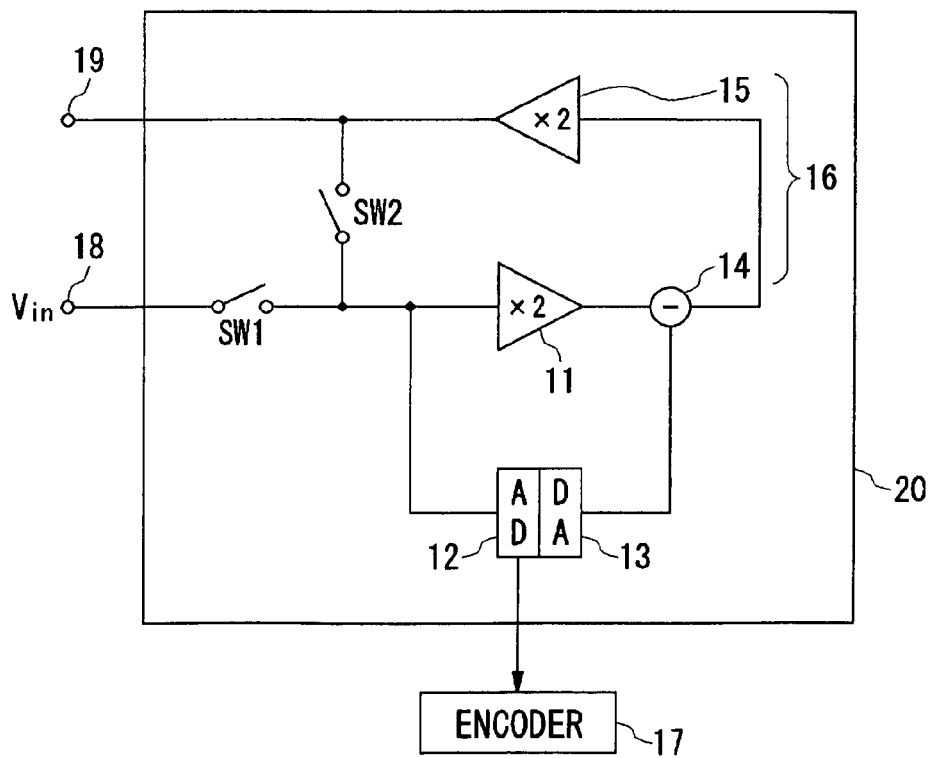
FIG. 2 is a diagram which shows a configuration of a cyclic A/D conversion unit according to the first embodiment.

FIG. 2 shows a configuration of a signal conversion unit 20 according to the first embodiment. The signal conversion unit 20 is a unit component of a cyclic A/D converting device, which will be referred to "cyclic A/D conversion unit 20" hereafter. The cyclic A/D conversion unit 20 further includes switching devices SW1 and SW2, in addition to the components of the pipeline A/D conversion unit 10 shown in FIG. 1. Upon turning on the switching device SW1, and turning off the switching device SW2, the analog signal Vin input to the input terminal 18 is input to the A/D converter 12 and the first amplifier 11, and a digital signal is acquired in the same way as with the pipeline A/D conversion unit 10. On the other hand, upon turning off the switching device SW1, and turning on the switching device SW2, the output analog signal from the second amplifier 15 is input to the A/D converter 12 and the first amplifier 11 in the form of a feedback signal, whereby the cyclic A/D conversion unit 20 performs A/D conversion again. Thus, A/D conversion is performed multiple times in a cyclic manner. Finally, the output from the second amplifier 15 is output from the cyclic A/D conversion unit 20 through the output terminal 19, and is input to the downstream A/D conversion unit, for example. With a configuration wherein the cyclic A/D conversion unit 20 performs A/D conversion up to the lowermost bit, the output from the second amplifier 15 needs not to be output, and accordingly, in this case, an arrangement may be made without the output terminal 19. The cyclic A/D conversion unit 20 has a function which allows the user to adjust the number of A/D conversion loops so as to realize various types and levels of performance, thereby improving degree-of-freedom from the perspective of circuit design.

Figure 3:
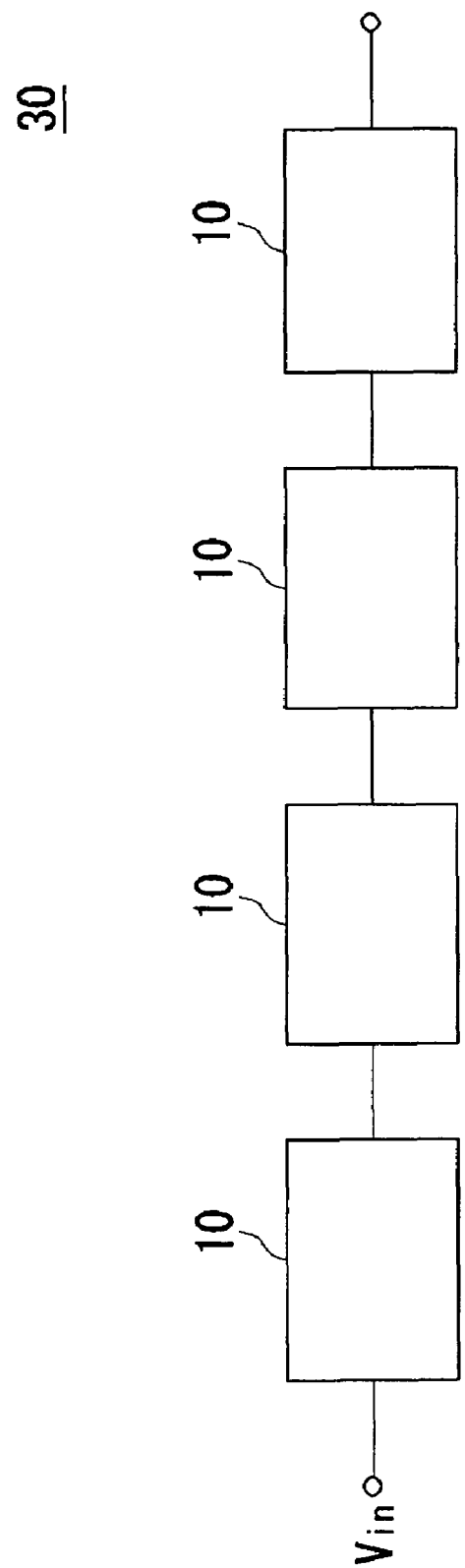
FIG. 3 is a diagram which shows a configuration of a conventional A/D converting device.

FIG. 3 shows a configuration of a conventional A/D converting device 30. The A/D converting device 30 has a configuration wherein the pipeline A/D conversion units 10 shown in FIG. 1 are connected one to another in a line. Let us say that each pipeline A/D conversion unit 10 has a function for acquiring a 3-bit digital signal at a sampling rate of 100 MS/s (mega-sample/second). In this case, giving consideration to redundant bits, the A/D converting device 30 has a function for performing 9-bit A/D conversion at a sampling rate of 100 MS/s. Note that the redundant bits are employed for improving the precision of A/D conversion with the A/D conversion units downstream of the first A/D conversion unit in a pipeline A/D converting device, or the precision of A/D conversions following the first A/D conversion with a cyclic A/D conversion unit having a function wherein A/D conversion is performed multiple times in a cyclic manner, either of which serves as subsequent A/D conversion for obtaining the lower bits of the digital signal of which the upper bits have been obtained by the previous A/D conversion. Let us say that the number of the redundant bits is 1. Accordingly, the second, third, and fourth pipeline A/D conversion units 10 each output a 2-bit (3 bits−1 bit=2 bits) digital signal. Thus, the A/D converting device outputs a digital signal of 9 bits (3+2 +2+2=9) in total. Let us say that each pipeline A/D conversion unit or a cyclic A/D conversion unit in a non-feedback mode operates at a sampling rate of 100 MS/s, and the number of the total bits is designed giving consideration to use of a single redundant bit, for evaluation of the performance of the A/D converting device.

Figure 4:
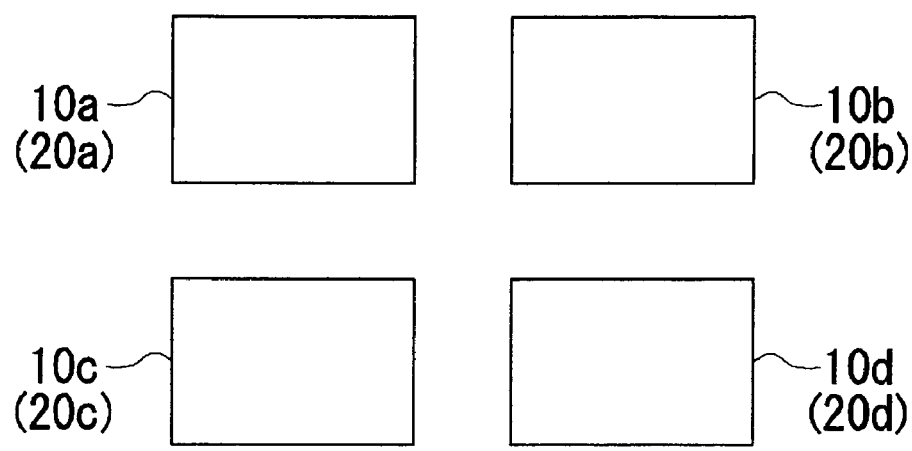
FIG. 4 is a diagram which shows an arrangement example of an A/D converting device according to the first embodiment.

FIG. 4 shows a configuration of an A/D converting device 40 according to the present embodiment. The A/D converting device 40 has a configuration wherein the pipeline A/D conversion units 10 shown in FIG. 1 or the cyclic A/D conversion units 20 shown in FIG. 2 are arrayed in multiple rows and columns. While FIG. 4 shows an example wherein the four pipeline A/D conversion units 10 or the four cyclic A/D conversion units 20 are arrayed in two rows and two columns, it is needless to say that an arrangement may be made wherein such A/D conversion units are arrayed in three or more rows and three or more columns. Furthermore, a desired combination of the pipeline A/D conversion units 10 and the cyclic A/D conversion units 20 may be employed. For example, a combination of the two pipeline A/D conversion units 10 and the two cyclic A/D conversion units 20 may be employed. Furthermore, the cyclic A/D conversion unit 20 may be used as the pipeline A/D conversion unit 10 wherein A/D conversion is performed once, i.e. is performed in the non-feedback mode.

While the conventional pipeline A/D conversion device 30 shown in FIG. 3 has a configuration wherein the pipeline A/D conversion units 10 are serially arrayed in a line, the A/D converting device 40 according to the present embodiment has a configuration wherein the A/D conversion units are two-dimensionally arrayed, thereby allowing the user to make flexible design of the layout and wiring for connecting with other circuits disposed therearound, thereby enabling modification of design with high flexibility without great change of design involving surrounding circuits, even in cases of change in the specifications.

Figure 5A:
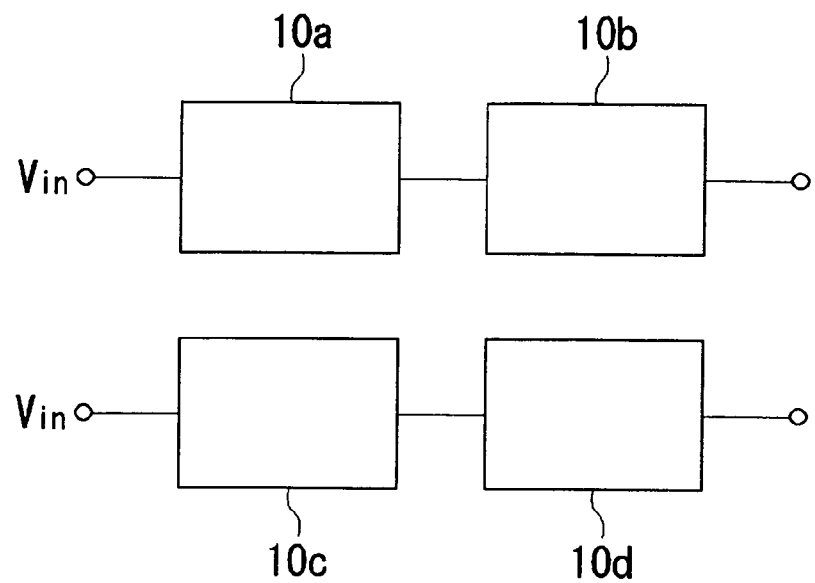
FIG. 5 is a diagram which shows a connection example between the A/D conversion units included in the A/D converting device shown in FIG. 4.

FIG. 5A shows an example of the A/D converting device 40 shown in FIG. 4, wherein the pipeline A/D conversion units 10$a$ and 10$b$ are connected one to another, and the pipeline A/D conversion units 10$c$ and 10$d$ are connected one to another. Let us say that the pipeline A/D conversion units 10$a$ through 10$d$ each have a function for outputting a 3-bit digital signal at a sampling rate of 100 MS/s. With a dual-circuit configuration wherein each circuit operates synchronously with the same clock signal, the A/D converting device 40 serves as a dual-circuit A/D converting device having a function for obtaining a 5-bit digital signal at a sampling rate of 100 MS/s as a designed value. On the other hand, with a configuration wherein the two circuits operate synchronously with opposite-phase clock signals for interleaving operation, the A/D converting device 40 serves as a single-circuit A/D converting device having a function for obtaining a 5-bit digital signal at a sampling rate of 200 MS/s as a designed value.

Figure 5B:
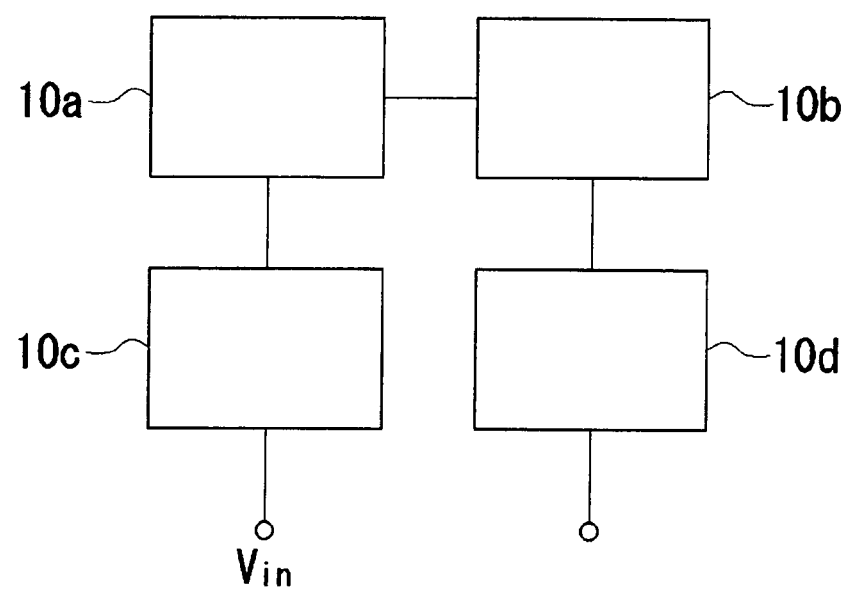

FIG. 5B shows an example of the A/D converting device 40 shown in FIG. 4, wherein the pipeline A/D conversion units 10a, 10b, 10c, and 10d, are connected in the order of 10c, 10a, 10b, and 10d, from the input terminal. The A/D converting device 40 serves as an A/D converting device having a function for obtaining a 9-bit digital signal at a sampling rate of 100 MS/s as a designed value in the same way as with the conventional A/D converting device 30 shown in FIG. 3.

Figure 6A:
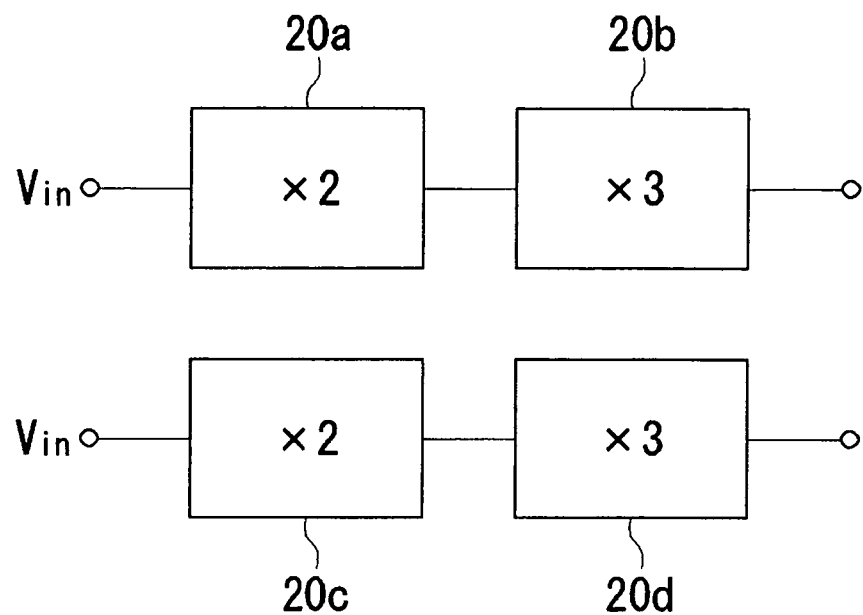
FIG. 6 is a diagram which shows a connection example between the A/D conversion units included in the A/D converting device shown in FIG. 4.

FIG. 6A shows an example of the A/D converting device 40 shown in FIG. 4, wherein the cyclic A/D conversion units 20a and 20b are connected one to another, and the cyclic A/D conversion units 20c and 20d are connected one to another. In the aforementioned example, the cyclic A/D conversion units 20a and 20c each perform single-feedback A/D conversion, and the cyclic A/D conversion units 20b and 20d each perform double-feedback A/D conversion. Here, the phrase "single-feedback A/D conversion" means A/D conversion wherein the output signal from the cyclic A/D conversion unit 20 is used as a feedback signal input to the same cyclic A/D conversion unit 20 once for each input signal, i.e., A/D conversion is performed a total of two times with the same single cyclic A/D conversion unit 20 for each input signal. With a dual-circuit configuration wherein each circuit operates synchronously with the same clock signal, the A/D converting device 40 serves as a dual-circuit A/D converting device having a function for obtaining an 11-bit digital signal at a sampling rate of 33 MS/s as a designed value. On the other hand, with a configuration wherein the two circuits operate synchronously with opposite-phase clock signals for interleaving operation, the A/D converting device 40 serves as a single-circuit A/D converting device having a function for obtaining an 11-bit digital signal at a sampling rate of 66 MS/s as a designed value.

Figure 6B:
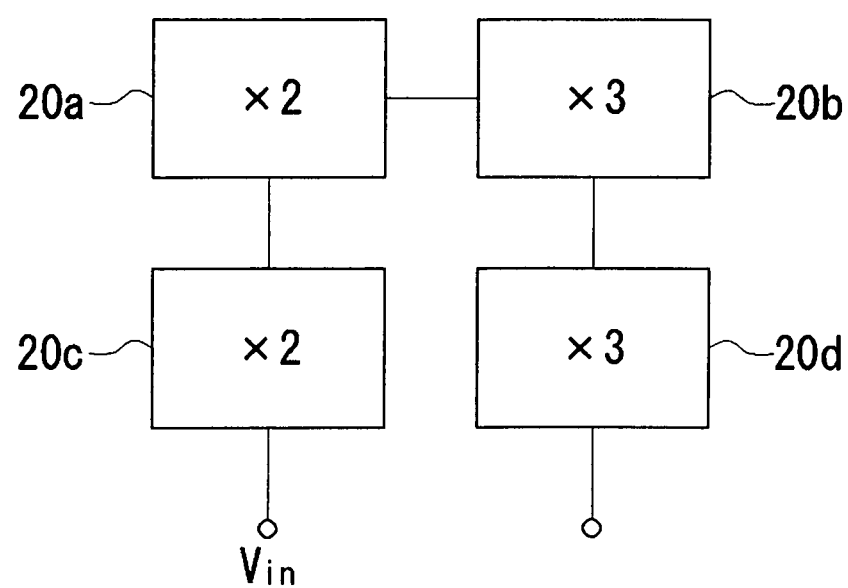

FIG. 6B shows an example of the A/D converting device 40 shown in FIG. 4, wherein the cyclic A/D conversion units 20a, 20b, 20c, and 20d, connected in the order of 20c, 20a, 20b, and 20d, from the input terminal. With such a configuration, the cyclic A/D conversion units 20a and 20c each perform single-feedback A/D conversion, and the cyclic A/D conversion units 20b and 20d each perform double-feedback A/D conversion, as shown in FIG. 6A. In this case, with the A/D converting device 40, the first cyclic A/D conversion unit 20c obtains a 3-bit digital signal by the first A/D conversion. Subsequently, A/D conversion is performed nine times (1+2+3+3=9) obtaining a two-bit digital signal each time, whereby the A/D converting device 40 serves as an A/D converting device having a function for obtaining a 21-bit digital signal at a sampling rate of 33 MS/s as a designed value.

As described above, with the present embodiment, a layout wherein such A/D conversion units are two-dimensionally arrayed is employed, thereby allowing the user to realize an A/D converting device according to various specifications with relative ease simply by modifying wiring without change of the layout. This enables a widely general-purpose A/D converting device. Furthermore, the circuit configuration wherein the A/D conversion units are arrayed may be registered in the IP library, which allows the user to make LSI design using the circuit configuration thus registered in the future.

Second Embodiment

With the present embodiment, each signal conversion unit includes a selecting means for selecting an input source or an output destination. This allows the user to realize an A/D converting device following the necessary specifications by making a desired combination of the signal conversion units without change of the layout. The present embodiment proposes a technique for realizing an A/D converting device following specifications, wherein the aforementioned selecting means, i.e., the portion which allows the user to select the wiring layout for connecting the signal conversion unit to another adjacent signal conversion unit or another circuit, is provided, thereby allowing the user to make necessary wiring in the wiring step in manufacturing.

Figure 7:
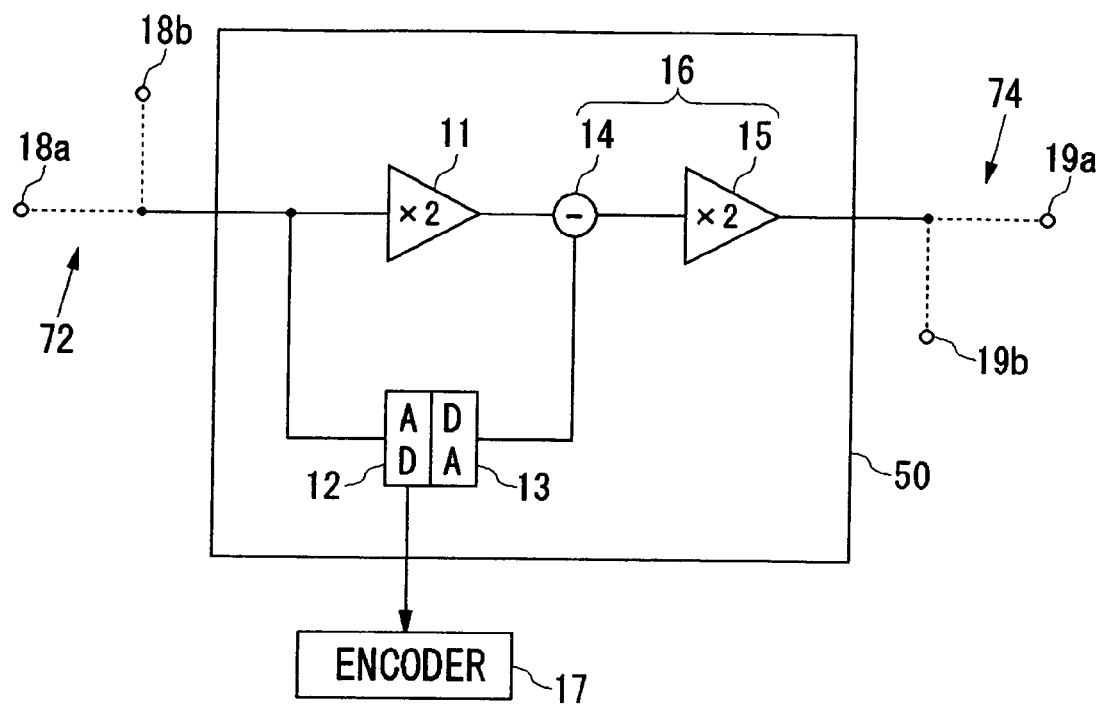
FIG. 7 is a diagram which shows a configuration of a pipeline A/D conversion unit according to a second embodiment.

FIG. 7 shows a configuration of a pipeline A/D conversion unit 50 according to the present embodiment. The pipeline A/D conversion unit 50 according to the present embodiment includes an input-wiring-selecting portion 72 for selecting the input source, and an output-wiring-selecting portion 74 for selecting the output destination, in addition to the components of the pipeline A/D conversion unit 10 according to the first embodiment shown in FIG. 1. A portion which allows the user to make wiring for connecting the pipeline A/D conversion unit 50 to another circuit may be employed as the input-wiring-selecting portion 72 and the output-wiring-selecting portion 74. In this case, necessary wiring is made in the wiring step, thereby determining the input source and the output destination for signals. FIG. 7 shows an example wherein the input-wiring-selecting portion 72 includes a wiring area which allows the user to select one from two input sources, and the output-wiring-selecting portion 74 includes a wiring area which allows the user to select one from two output destinations. Note that the input-wiring-selecting portion 72 may include a wiring area for selecting one from three or more input sources, and the output-wiring-selecting portion 74 may include a wiring area for selecting one from three or more output destinations. For example, an arrangement may be made wherein the input-wiring-selecting portion 72 and the output-wiring-selecting portion 74 are disposed on each of the four sides of the pipeline A/D conversion unit 50 for allowing the user to select the input source and the output destination for signals, from other signal conversion units adjacent to the four sides thereof.

Figure 8:
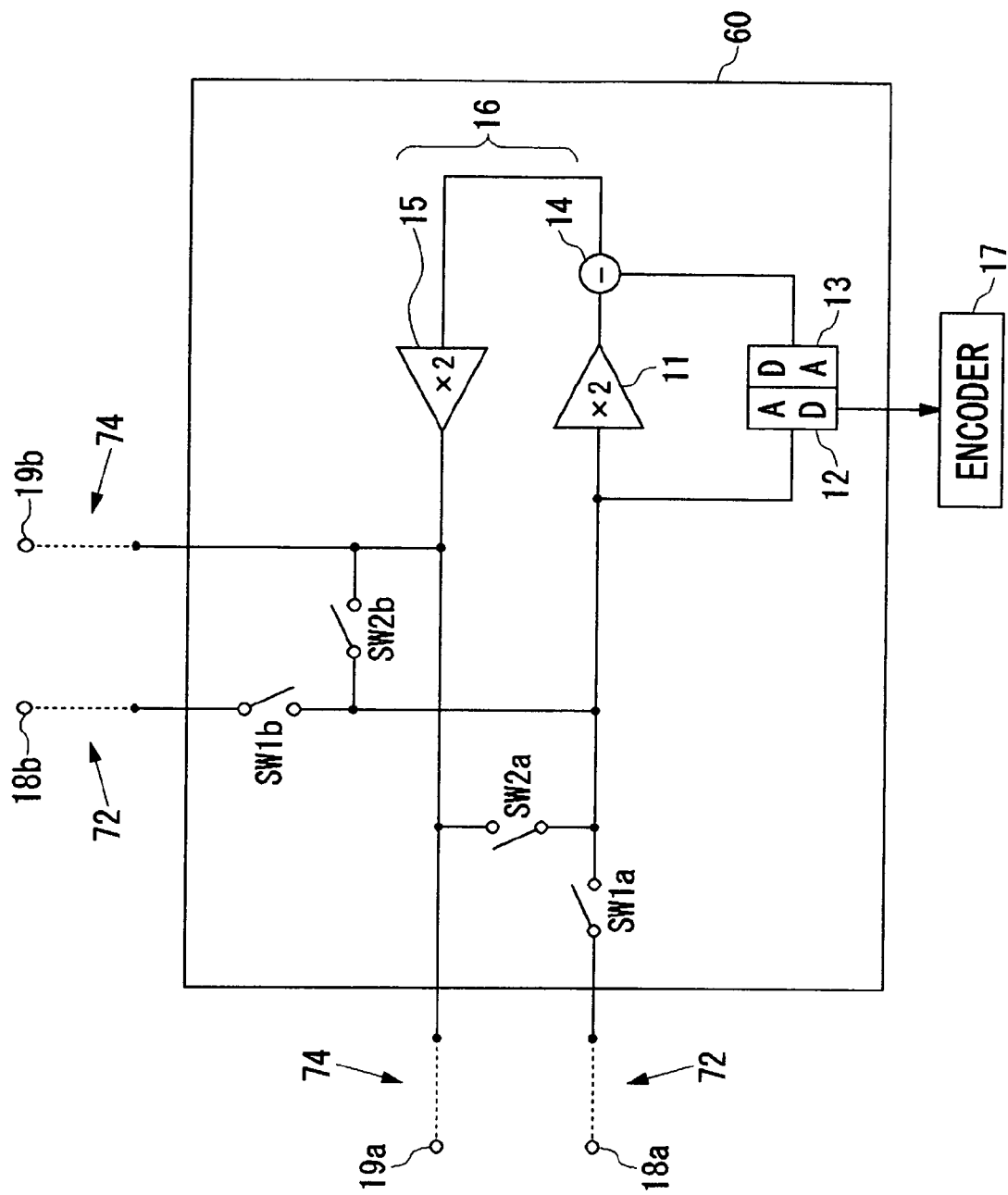
FIG. 8 is a diagram which shows a configuration of a cyclic A/D conversion unit according to the second embodiment.

FIG. 8 shows a configuration of a cyclic A/D conversion unit 60 according to the present embodiment. The cyclic A/D conversion unit 60 according to the present embodiment includes the input-wiring-selecting portion 72 for selecting the input source, and the output-wiring-selecting portion 74 for selecting the output destination, in addition to the components of the cyclic A/D conversion unit 20 according to the first embodiment shown in FIG. 2. FIG. 8 shows an example which includes switching devices SW1a, SW1b, SW2a, and SW2b, for selecting whether the external signal is to be used as the input signal, or the output from the same cyclic A/D conversion unit 60 is to be used as a feedback signal, as well as allowing the user to select one from two input sources. As another example, the cyclic A/D conversion unit 60 may include a switching device having functions serving as the switching devices SW1a, SW1b, SW2a, and SW2b, instead of these four switches, as well as including the input-wiring-selecting portion 72 and the output-wiring-selecting unit 74 having the same configuration as with the pipeline A/D conversion unit 50 shown in FIG. 7. Furthermore, the cyclic A/D conversion unit 60 may include a switching device having functions serving as the switching devices SW2a and SW2b, instead of these two switches.

Figure 9A:
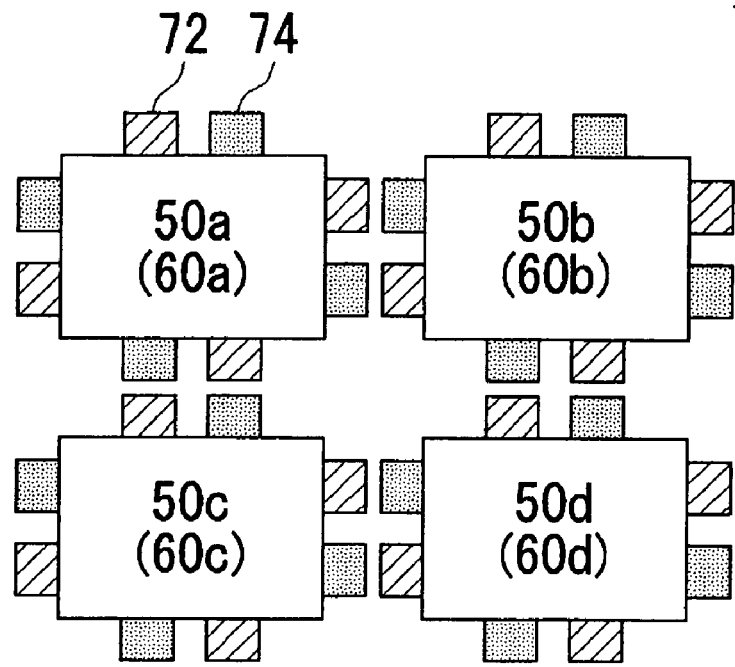
FIG. 9 is a diagram which shows a configuration example of an A/D converting device according to the second embodiment.
Figure 9B:
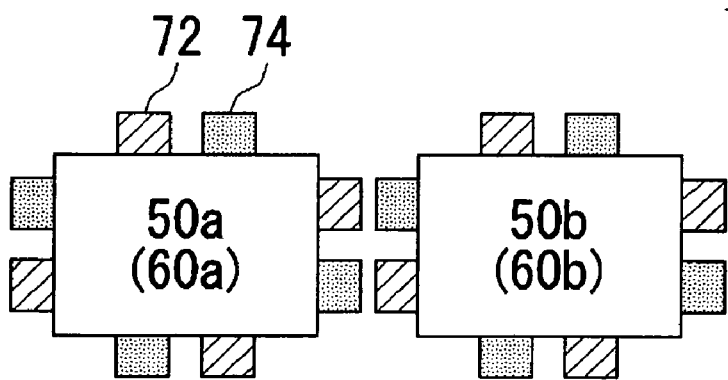

FIG. 9A shows a configuration of an A/D converting device 42 according to the present embodiment, and FIG. 9B shows a configuration of an A/D converting device 44 according to the present embodiment. The A/D converting device 42 shown in FIG. 9A has a configuration wherein the pipeline A/D conversion units 50 shown in FIG. 7 or the cyclic A/D conversion units 60 shown in FIG. 8 are disposed in the form of a 2×2 matrix. The A/D converting device 44 shown in FIG. 9B has a configuration wherein the two pipeline A/D conversion units 50 or the two cyclic A/D conversion units 60 are disposed in a line. With the present embodiment, the pipeline A/D conversion units 50 or the cyclic A/D conversion units 60 may be two-dimensionally arrayed, or may be disposed in a line. FIG. 9A and FIG. 9B show examples wherein the input-wiring-selecting portion 72 and the output-wiring-selecting portion 74 are disposed on each of four sides of the pipeline A/D conversion units 50 or the cyclic A/D conversion units 60. Such a configuration allows the user to select another desired pipeline A/D conversion unit 50 or another desired cyclic A/D conversion unit 60 adjacent to the upper, lower, left, and right sides thereof, as the input source or the output destination for signals, thereby further improving flexibility from the perspective of circuit design.

Figure 10A:
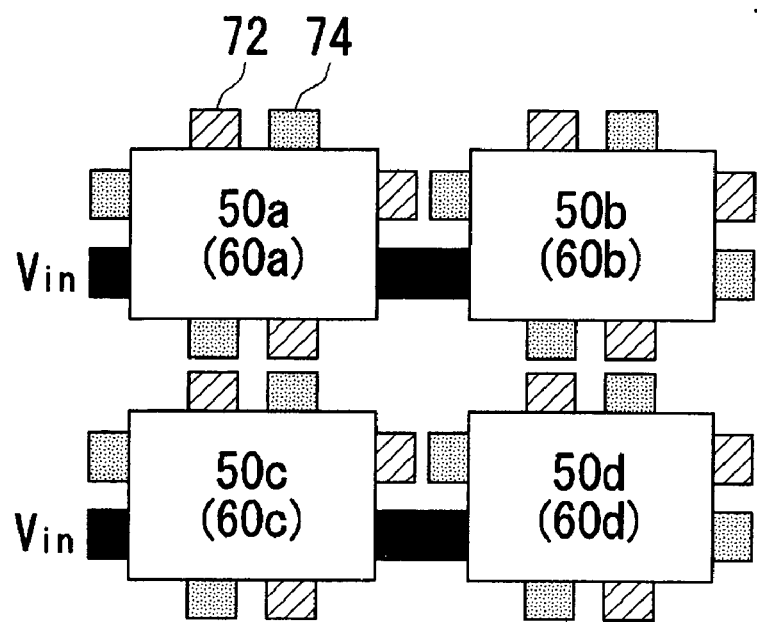
FIG. 10 is a diagram which shows a connection example between the signal conversion units included in the A/D converting device shown in FIG. 9.

FIG. 10A shows an example which realizes an A/D converting device having the same functions as with the A/D converting device 40 shown in FIG. 5A, using the layout of the A/D converting device 42 shown in FIG. 9A. With the A/D converting device 42 shown in the drawing, wiring is made at one of the input-wiring-selecting portions 72 of the pipeline A/D conversion unit 50a for inputting the input analog signal Vin, and one of the output-wiring-selecting portions 74 of the pipeline A/D conversion unit 50a is connected to one of the input-wiring-selecting portions 72 of the pipeline A/D conversion unit 50b by wiring. In the same way, wiring is made at one of the input-wiring-selecting portions 72 of the pipeline A/D conversion unit 50c for inputting the input analog signal Vin, and one of the output-wiring-selecting portions 74 of the pipeline A/D conversion unit 50c is connected to one of the input-wiring-selecting portions 72 of the pipeline A/D conversion unit 50d by wiring.

Figure 10B:
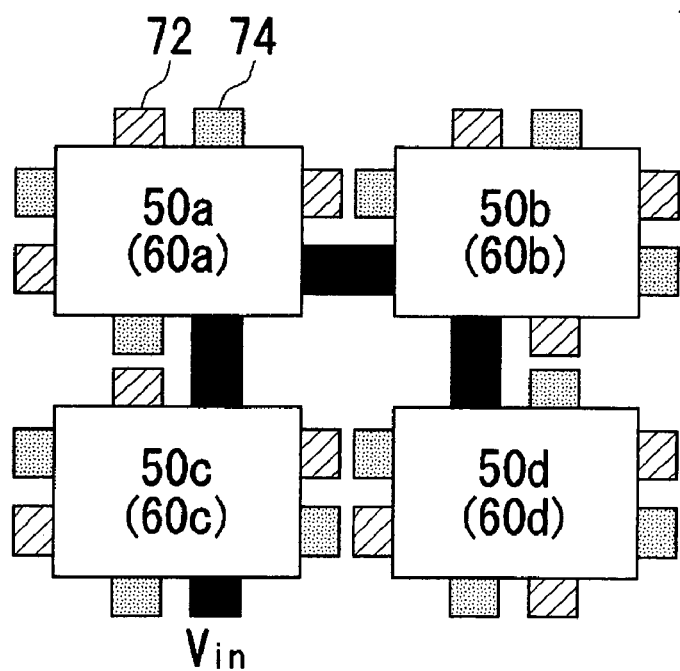

FIG. 10B shows an example which realizes an A/D converting device having the same functions as with the A/D converting device 40 shown in FIG. 5B, using the layout of the A/D converting device 42 shown in FIG. 9A. With the A/D converting device 42 shown in the drawing, wiring is made at one of the input-wiring-selecting portions 72 of the pipeline A/D conversion unit 50c for inputting the input analog signal Vin, one of the output-wiring-selecting portions 74 of the pipeline A/D conversion unit 50c is connected to one of the input-wiring-selecting portions 72 of the pipeline A/D conversion unit 50a by wiring, one of the output-wiring-selecting portions 74 of the pipeline A/D conversion unit 50a is connected to one of the input-wiring-selecting portions 72 of the pipeline A/D conversion unit 50b by wiring, and one of the output-wiring-selecting portions 74 of the pipeline A/D conversion unit 50b is connected to one of the input-wiring-selecting portions 72 of the pipeline A/D conversion unit 50d by wiring.

Figure 11A:
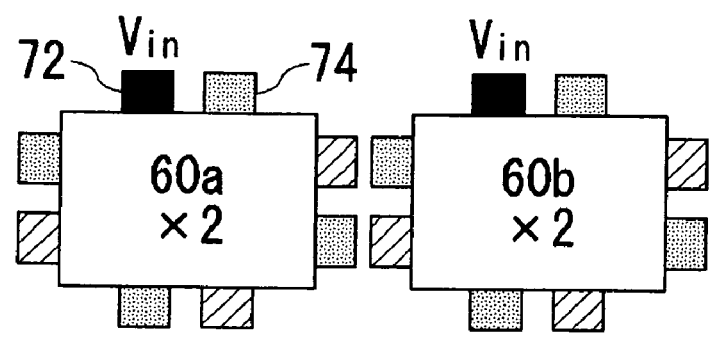
FIG. 11 is a diagram which shows a connection example between the signal conversion units included in the A/D converting device shown in FIG. 9.

FIG. 11A shows an example which realizes a dual-circuit A/D converting device using the layout of the A/D converting device 44 shown in FIG. 9B. With this example, the cyclic A/D conversion units 60a and 60b each perform single-feedback A/D conversion. Let us say that each cyclic A/D conversion unit 60 obtains a 3-bit digital signal at a sampling rate of 100 MS/s for each A/D conversion. In this case, the A/D converting device 44, having a dual-circuit configuration synchronously with the same single clock signal, serves as a dual-circuit A/D converting device having a function for obtaining a 5-bit digital signal at a sampling rate of 50 MS/s as a designed value. On the other hand, the A/D converting device 44, having a configuration synchronously with the opposite-phase clock signals for interleaving operation, serves as a single-circuit A/D converting device having a function for obtaining a 5-bit digital signal at a sampling rate of 100 MS/s as a designed value.

Figure 11B:
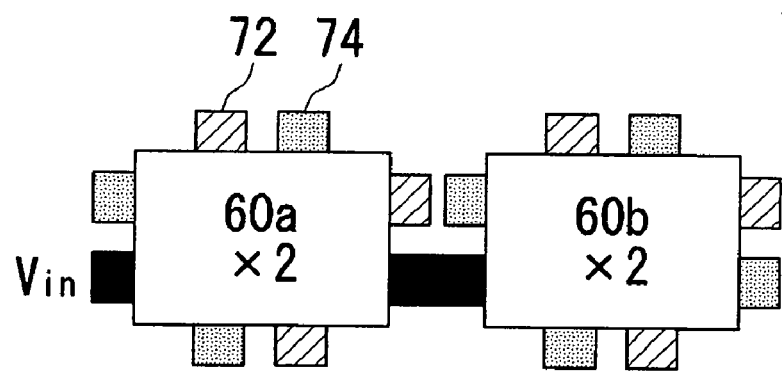

FIG. 11B shows an example which realizes a single-circuit A/D converting device having a configuration wherein the cyclic A/D conversion units 60a and 60b are connected in a line using the layout of the A/D converting device 44 shown in FIG. 9B. With this example, the cyclic A/D conversion units 60a and 60b each perform single-feedback A/D conversion. Let us say that cyclic A/D conversion units 60a and 60b each obtain a 3-bit digital signal at a sampling rate of 100 MS/s for each A/D conversion. In this case, the A/D converting device 44 serves as a single-circuit A/D converting device having a function for obtaining a 9-bit digital signal at a sampling rate of 50 MS/s as a designed value.

As described above, the wiring-selecting arrangement is provided with the present embodiment, which allows the user to select the input source or the output destination for signals, thereby realizing a widely general-purpose A/D converting device which can be modified for various use without redesign. Furthermore, reuse of such a widely general-purpose circuit registered as an IP enables greatly reduced costs of development while greatly reducing the development time for the A/D converting device.

In manufacturing of an A/D converting device according to predetermined specifications, first, a suitable combination of the signal conversion units is designed, and wiring is determined, for realizing the functions following the specifications, using a layout of an A/D converting device having a configuration wherein multiple signal conversion units are disposed, each of which have a function which allows the user to select the input source or the output destination for signals by wiring. Then, in the wiring step in manufacturing, wiring is made using metal or the like according to circuit design, whereby the signal conversion units are connected one to another. This enables modification of the A/D converting device having various functions simply by modifying wiring design. Furthermore, this facilitates modification of the A/D converting device according to other specifications.

Third Embodiment

With the present embodiment, a switching element is provided as a selecting means for selecting the input source or the output destination. With such a configuration, the switching element is turned on and off so as to dynamically change the combination of the signal conversion units or the wiring configuration therebetween according to the performance required for this particular processing, thereby realizing an A/D converting device having desired performance.

Figure 12:
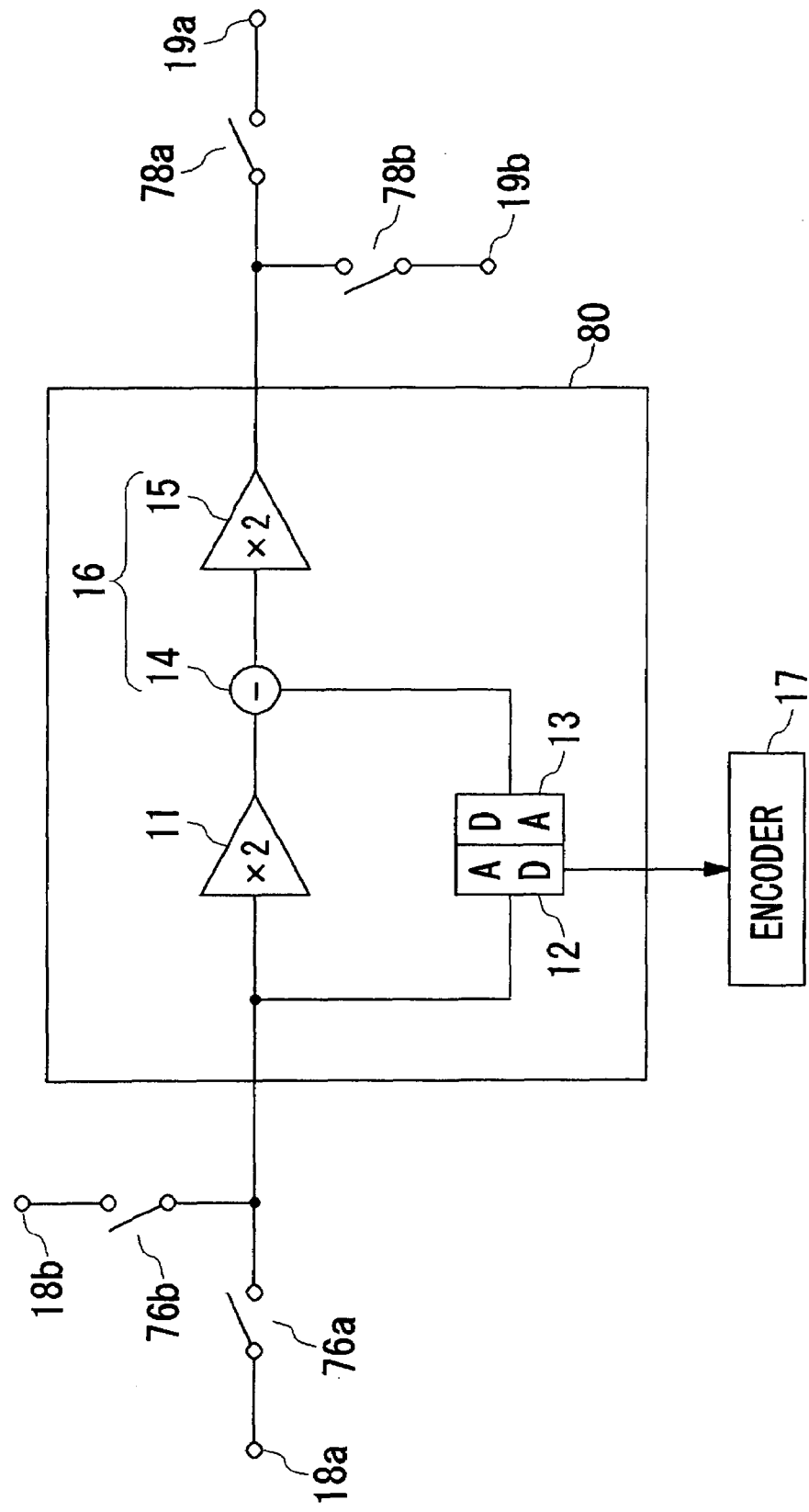
FIG. 12 is a diagram which shows a configuration of a pipeline A/D conversion unit according to a third embodiment.

FIG. 12 shows a configuration of a pipeline A/D conversion unit 80 according to the present embodiment. The configuration of the pipeline A/D conversion unit 80 includes switching elements 76a and 76b for switching the input source for signals, and switching elements 78a and 78b for switching the output destination for signals, in addition to the components of the pipeline A/D conversion unit 10 according to the first-embodiment shown in FIG. 1. While FIG. 12 shows an example including the two switching elements 76a and 76b for switching the input source, and the two switching elements 78a and 78b for switching the output destination, an arrangement may be made wherein three or more switching elements are provided for selecting three or more input sources or output destinations.

Figure 13:
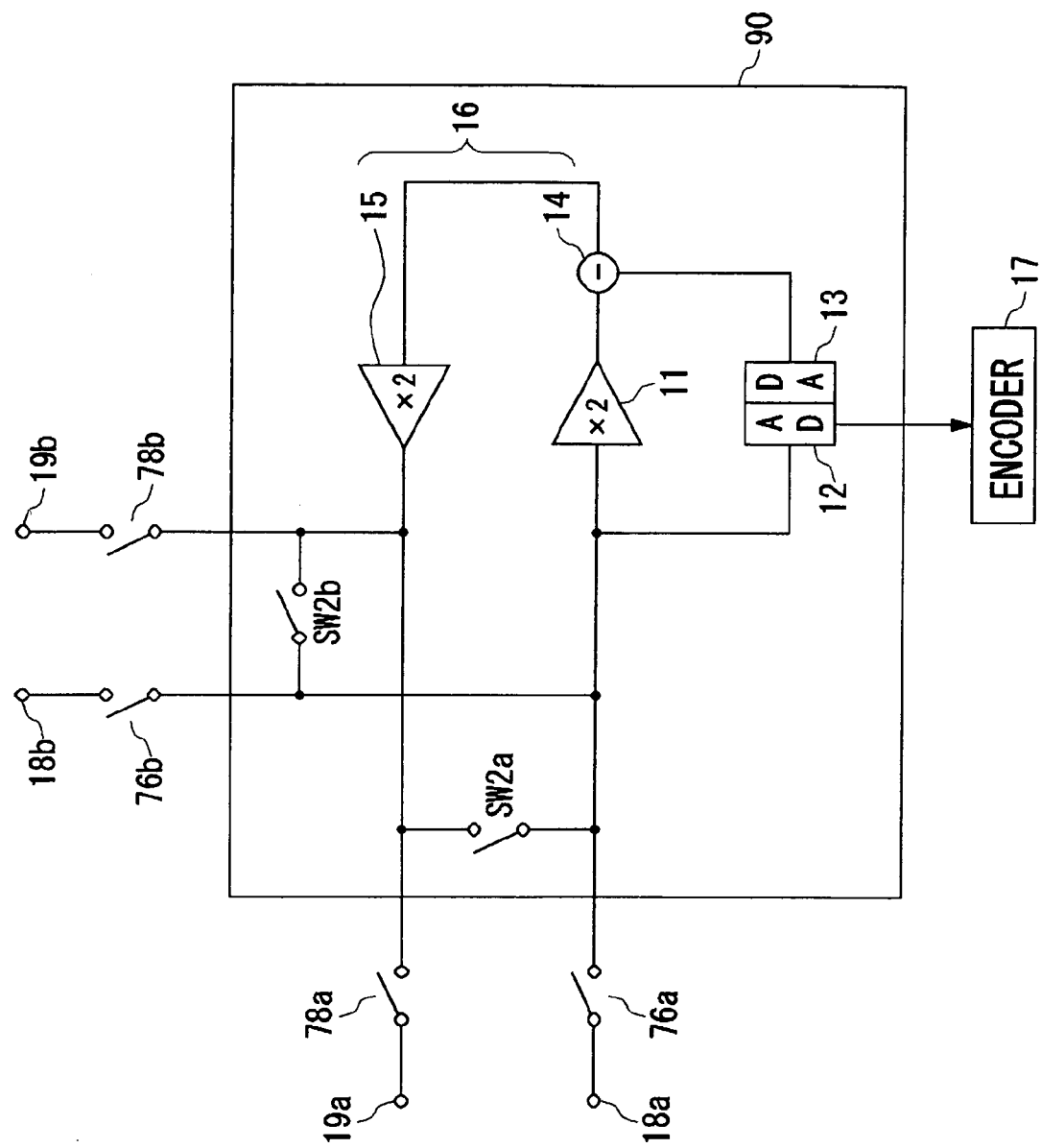
FIG. 13 is a diagram which shows a configuration of a cyclic A/D conversion unit according to the third embodiment.

FIG. 13 shows a configuration of a cyclic A/D conversion unit 90 according to the present embodiment. The configuration of the cyclic A/D conversion unit 90 includes switching elements 76a and 76b for switching the input source for signals, and switching elements 78a and 78b for switching the output destination for signals, in addition to the components of the cyclic A/D conversion unit 20 according to the first embodiment shown in FIG. 2. FIG. 13 shows an example wherein the switching elements 76a and 76b for switching the input source also have the function serving as the switching device SW1 included in the cyclic A/D conversion unit 20 according to the first embodiment shown in FIG. 2, which has a function wherein, upon turning on the switching device SW1, the external signal is used as the input signal.

Figure 14A:
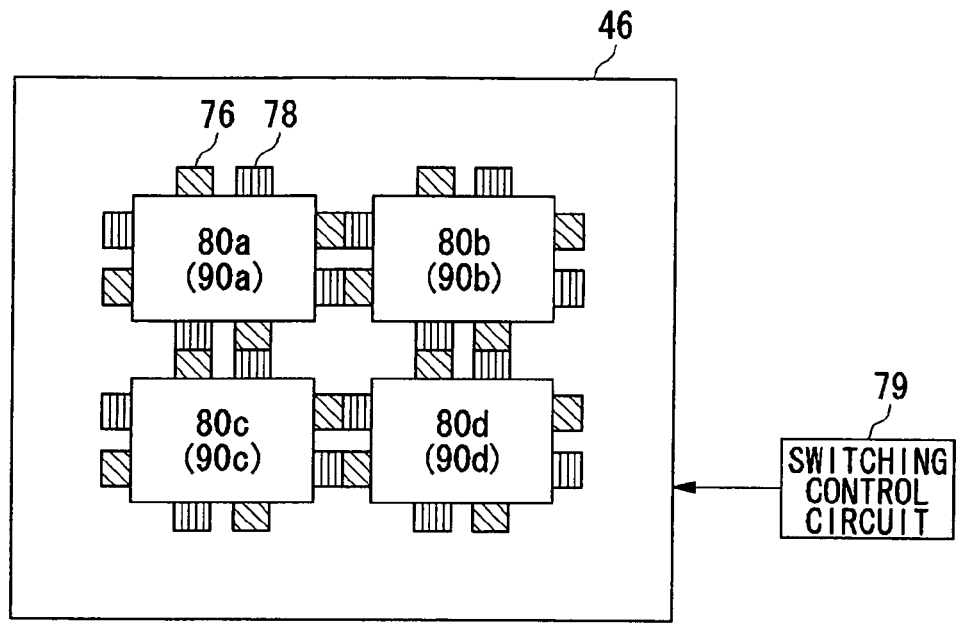
FIG. 14 is a diagram which shows an arrangement example of an A/D converting device according to the third embodiment.
Figure 14B:
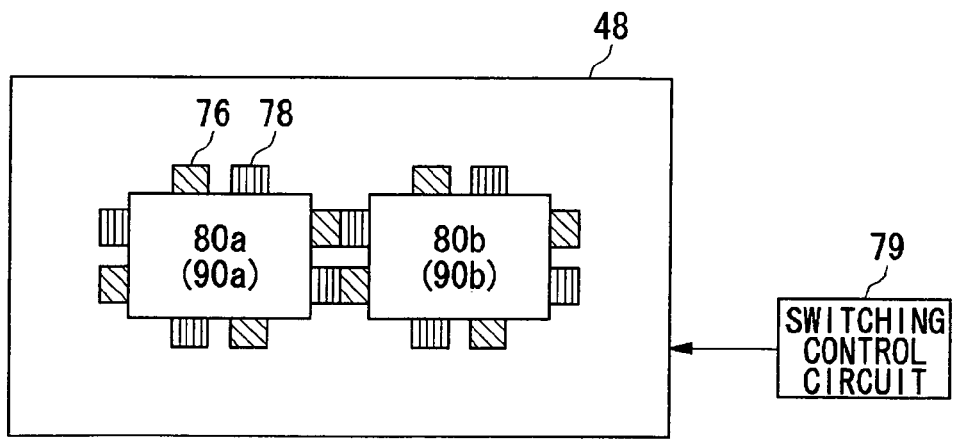

FIG. 14A shows a configuration of an A/D converting device 46 according to the present embodiment, and FIG. 14B shows a configuration of an A/D converting device 48 according to the present embodiment. The A/D converting device 46 shown in FIG. 14A has a configuration wherein the pipeline A/D conversion units 80 shown in FIG. 12 or the cyclic A/D conversion units 90 shown in FIG. 13 are disposed in the form of a 2×2 matrix. On the other hand, the A/D converting device 48 shown in FIG. 14B has a configuration wherein the two pipeline A/D conversion units 80 shown in FIG. 12 or the two cyclic A/D conversion units 90 shown in FIG. 13 are disposed in a line. With the A/D converting device according to the present embodiment, the pipeline A/D conversion units 50 or the cyclic A/D conversion units 60 may be two-dimensionally arrayed, as well as being disposed in a line.

A switching control circuit 79 performs on/off control of the switching element 76 for switching the input source for signals, and the switching element 78 for switching the output destination for signals. The aforementioned on/off control of the switching elements 76 and 78 by the switching control circuit 79 allows the user to select whether the A/D converting device 46 shown in FIG. 14A has the functions serving as the A/D converting device 42 shown in FIG. 10A, or has the functions serving as the A/D converting device 42 shown in FIG. 10B, for example. Furthermore, such on/off control allows the user to make other connection configurations, thereby realizing an A/D converting device having further different functions. The switching control circuit 79 may dynamically or statically control on/off operation of the switching elements 76 and 78. In a case wherein the switching control circuit 79 dynamically controls the switching elements 76 and 78, the switching control circuit 79 may control on/off operation of the switching elements 76 and 78 according to instructions to change the performance such as the sampling rate, the number of bits, the precision, and so forth, in order to change the combination of the signal conversion units or the order of connection thereof, thereby realizing the necessary performance.

The A/D converting device may include the switching control circuit 79 therewithin, or a device including the A/D converting device may also include the switching control circuit 79 therewithin. With an arrangement wherein the A/D converting device includes the switching control circuit 79 therewithin, the switching control circuit 79 may have a table storing the relation between the operating mode and the on/off operation of the switching elements 76 and 78. With such a configuration, an arrangement may be made wherein, in the event of receiving notification from the device that the operating mode has been changed, the switching control circuit 79 controls on/off operation of the switching elements 76 and 78 by referring to the table. With an arrangement wherein a device including the A/D converting device also includes the switching control circuit 79, the switching control circuit 79 may be realized in the form of a CPU, for example, having the functions for determining the performance required for the A/D converting device based upon the operating mode of the device, and controlling on/off operation of the switching elements 76 and 78 for realizing the performance thus determined.

With the configuration and operation described above, the configuration of the A/D converting device can be modified by on/off operation of the switching elements 76 and 78, thereby realizing a widely general-purpose A/D converting device having adjustable performance of, for example, the sampling rate, the number of bits, precision, and so forth. Furthermore, the technique according to the present embodiment allows the user to even handle situations wherein an electronic device is required to include A/D converting devices following multiple specifications, simply by designing a single A/D converting device alone. This enables the reduced circuit area of the A/D converting device, thereby contributing to the reduced size of the device, reduced weight thereof, and reduced costs thereof.

In the event that there are any signal conversion units not used in this particular mode determined by on/off operation of the switching elements 76 and 78, the switching control circuit 79 may control these signal conversion units to stop power supply for the circuits within these signal conversion units. Specifically, the switching control circuit 79 may transmits a standby signal to each circuit of the signal conversion unit not used in this particular mode for turning off the power supply thereof. This enables reduced power consumption of the A/D converting device.

While description has been made above regarding the present invention with reference to the aforementioned embodiments, the above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

What is claimed is:
1. An analog/digital converting device comprising:
a plurality of signal conversion units, each signal conversion unit including:
an A/D converter for converting an input analog signal into a digital signal with a predetermined number of bits,
a D/A converter for converting the output from said A/D converter into an analog signal, and a subtracter for subtracting the output signal from said D/A converter, from said input analog signal; and a selecting means for selecting an input source for said input analog signal or an output destination for the output signal from said signal conversion unit, among a plurality of signal lines.

2. An analog/digital converting device according to claim 1, further comprising an amplifier for amplifying the output signal from said subtracter.

3. An analog/digital converting device according to claim 2, wherein said signal conversion unit includes a switching unit for switching whether the output signal from said same signal conversion unit is used as the input analog signal or an external signal is used as the input analog signal.

4. An analog/digital converting device according to claim 2, wherein said selecting means can select the input source or the output destination from a plurality of circuits adjacent to said signal conversion unit.

5. An analog/digital converting device according to claim 1, wherein said signal conversion unit includes a switching unit for switching whether the output signal from said same signal conversion unit is used as the input analog signal or an external signal is used as the input analog signal.

6. An analog/digital converting device according to claim 5, wherein said selecting means can select the input source or the output destination from a plurality of circuits adjacent to said signal conversion unit.

7. An analog/digital converting device according to claim 1, wherein said selecting means can select the input source or the output destination from a plurality of circuits adjacent to said signal conversion unit.

8. An analog/digital converting device according to claim 1, wherein each signal conversion unit includes said selecting means.

9. An analog/digital converting device according to claim 1, wherein said selecting means is formed of a wiring area for connecting said signal conversion unit to the input source or the output destination.

10. An analog/digital converting device according to claim 1, of which said selecting means is formed of switching element, further comprising switching control means, wherein said switching control means controls on/off operation of said switching element corresponding to a performance required for said analog/digital converting device.

11. An analog/digital converting device according to claim 10, wherein, in the event that there are any signal conversion units not used in a particular mode as a result of on/off operation of said switching element, said switching control means reduces power supply for said signal conversion unit not used in this particular mode.

* * * * *

UNITED STATES PATENT AND TRADEMARK OFFICE
CERTIFICATE OF CORRECTION

PATENT NO. : 7,274,320 B2  
APPLICATION NO. : 11/506778  
DATED : September 25, 2007  
INVENTOR(S) : Atsushi Wada et al.

Page 1 of 1

It is certified that error appears in the above-identified patent and that said Letters Patent is hereby corrected as shown below:

On the title page, in the Related U.S. Application Data (62), delete "11/114,004, filed on Apr. 26, 2005" and add --11/061,668, filed on February 22, 2005--

On the title page add item (30) Foreign Application Priority Data,  
--Feb. 27, 2004 (JP) ................................ 2004-055220--  
--Feb. 27, 2004 (JP) ................................ 2004-055221--

Signed and Sealed this  
Seventeenth Day of November, 2015

Michelle K. Lee  
*Director of the United States Patent and Trademark Office*